(12) United States Patent
Weng (10) Patent No.: US 9,955,590 B2
(45) Date of Patent: Apr. 24, 2018

(54) REDISTRIBUTION LAYER STRUCTURE, SEMICONDUCTOR SUBSTRATE STRUCTURE, SEMICONDUCTOR PACKAGE STRUCTURE, CHIP STRUCTURE, AND METHOD OF MANUFACTURING THE SAME

(71) Applicant: Advanced Semiconductor Engineering, Inc., Kaohsiung (TW)

(72) Inventor: Chao-Fu Weng, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/919,343

(22) Filed: Oct. 21, 2015

(65) Prior Publication Data

US 2017/0117240 A1   Apr. 27, 2017

(51) Int. Cl.
| | |
|---|---|
| *H05K 3/46* | (2006.01) |
| *H05K 1/11* | (2006.01) |
| *H01L 23/20* | (2006.01) |
| *H05K 3/10* | (2006.01) |
| *H01L 23/00* | (2006.01) |

(52) U.S. Cl.
CPC ............ *H05K 3/465* (2013.01); *H05K 1/113* (2013.01); *H01L 24/20* (2013.01); *H01L 2224/12105* (2013.01); *H01L 2224/13082* (2013.01); *H01L 2224/16237* (2013.01); *H01L 2224/20* (2013.01); *H05K 3/107* (2013.01); *H05K 2201/09845* (2013.01); *H05K 2201/10674* (2013.01); *H05K 2203/1173* (2013.01)

(58) Field of Classification Search
CPC . H01L 24/02; H01L 24/13; H01L 2224/0235; H01L 2224/0239; H01L 2224/024; H01L 2224/13024
See application file for complete search history.

(56) References Cited

U.S. PATENT DOCUMENTS

| | | | |
|---|---|---|---|
| 5,462,897 A | 10/1995 | Baum et al. | |
| 5,614,765 A * | 3/1997 | Avanzino | .......... H01L 21/76807 257/763 |
| 6,004,619 A | 12/1999 | Dippon et al. | |
| 6,025,275 A * | 2/2000 | Efland | ............... H01L 21/76802 257/E21.577 |
| 8,017,022 B2 | 9/2011 | Jomaa et al. | |
| 8,240,036 B2 | 8/2012 | Yoshioka et al. | |
| 8,272,126 B2 | 9/2012 | Yoshioka et al. | |
| 8,273,256 B2 | 9/2012 | Chiang et al. | |
| 8,273,651 B2 | 9/2012 | Chiang et al. | |
| 8,698,003 B2 | 4/2014 | Yoshioka et al. | |
| 2002/0140103 A1* | 10/2002 | Kloster | ............. H01L 21/76801 257/767 |

(Continued)

*Primary Examiner* — Moazzam Hossain
*Assistant Examiner* — Farun Lu
(74) *Attorney, Agent, or Firm* — Foley & Lardner LLP (57) ABSTRACT

The present disclosure relates to redistribution layer structures useful in semiconductor substrate packages, semiconductor package structures, and chip structures. In an embodiment, a redistribution layer structure includes a dielectric layer, an anti-plating layer, and a conductive material. The dielectric layer defines one or more trenches. The conductive material is disposed in the trench(es), and the anti-plating layer is disposed on a surface of the dielectric layer.

13 Claims, 10 Drawing Sheets

(56) References Cited

U.S. PATENT DOCUMENTS

| | | | |
|---|---|---|---|
| 2006/0081987 A1* | 4/2006 | Kobayashi | H01L 21/76801 257/751 |
| 2006/0254504 A1* | 11/2006 | Dai | C23C 18/1844 117/84 |
| 2013/0317421 A1* | 11/2013 | Choi | H01Q 1/22 604/66 |
| 2014/0045326 A1* | 2/2014 | Liang | H01L 23/3192 438/613 |
| 2015/0123285 A1* | 5/2015 | Lin | H01L 21/78 257/774 |
| 2015/0293347 A1* | 10/2015 | Kreit | G02F 1/172 359/290 |
| 2015/0325552 A1* | 11/2015 | Liu | H01L 24/49 257/738 |

* cited by examiner

REDISTRIBUTION LAYER STRUCTURE, SEMICONDUCTOR SUBSTRATE STRUCTURE, SEMICONDUCTOR PACKAGE STRUCTURE, CHIP STRUCTURE, AND METHOD OF MANUFACTURING THE SAME

BACKGROUND

1. Technical Field

The present disclosure relates to a redistribution layer structure, a semiconductor substrate structure, a semiconductor package structure, a chip structure, and a method of manufacturing the same, and, more particularly, to a redistribution layer structure including an anti-plating layer disposed on a surface of a dielectric layer.

2. Description of the Related Art

Reduction in size and pitch of integrated circuit devices propels advancements in the manufacture of IC package substrates. For example, use of laser drilling is becoming more common for patterning substrates. Improvements in metallization techniques for plating laser projection patterned substrates are desirable, such as improvements that reduce costs, manufacturing time, and damage to the patterns or to the substrates.

SUMMARY

One aspect of the present disclosure relates to a redistribution layer structure. In an embodiment, the redistribution layer structure includes a dielectric layer, an anti-plating layer, and a conductive material. The dielectric layer defines one or more trenches. The anti-plating layer is disposed on a surface of the dielectric layer. The conductive material is disposed in the trench(es).

Another aspect of the present disclosure relates to a semiconductor substrate structure. In an embodiment, the semiconductor substrate structure includes a redistribution layer structure. The redistribution layer structure includes a dielectric layer and an anti-plating layer disposed on the dielectric layer, a conductive material disposed in the dielectric layer, and a patterned conductive layer disposed adjacent to the conductive material and electrically connected to the conductive material.

Another aspect of the present disclosure relates to a chip structure. In an embodiment, the chip structure includes a die, a dielectric layer, an anti-plating layer, a conductive material, and a connecting element. The dielectric layer is disposed adjacent to a surface of the die. The anti-plating layer is disposed on a surface of the dielectric layer. The conductive material is disposed in the dielectric layer and is electrically connected to the die. The connecting element is disposed on the conductive material.

Another aspect of the present disclosure relates to a method of manufacturing a redistribution layer structure. In an embodiment, the method includes forming an anti-plating layer on a surface of a dielectric layer; ablating the surface of the dielectric layer and the anti-plating layer to form an opening in the anti-plating layer and a trench in the dielectric layer, wherein the opening corresponds to the trench; and electroless plating a conductive material in the trench, wherein the anti-plating layer remains on the surface of the dielectric layer.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
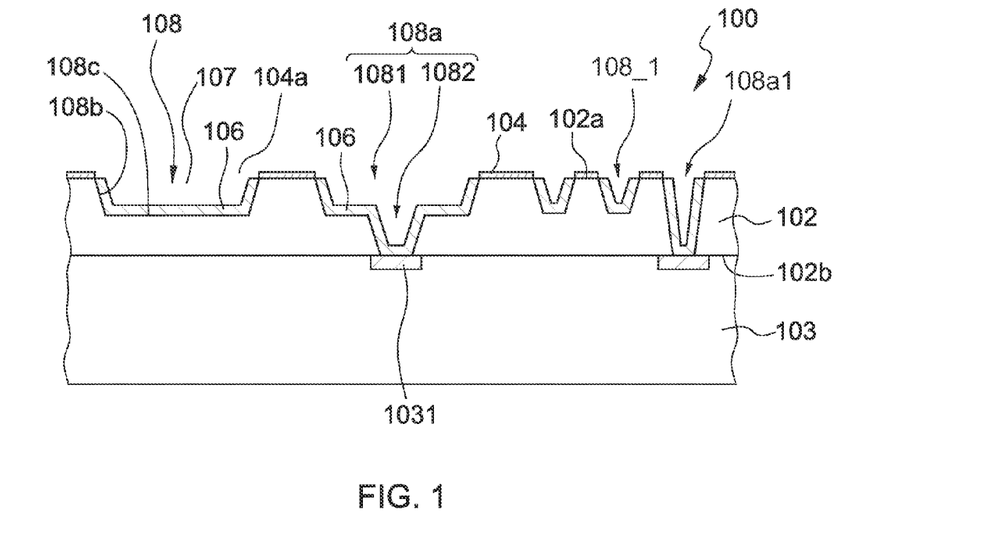
FIG. 1 illustrates a cross-sectional view of a redistribution layer structure according to an embodiment of the present disclosure.

FIG. 1 illustrates a cross-sectional view of a redistribution layer structure 100 according to an embodiment of the present disclosure. The redistribution layer structure 100 of FIG. 1 includes a dielectric layer 102, an anti-plating layer 104, and a conductive material 106. In one or more embodiments, the redistribution layer structure 100 is disposed on a carrier 103, and the carrier 103 includes one or more pads 1031. The carrier 103 may be another dielectric layer (e.g., dielectric layer 818 in FIG. 10) or a core layer (e.g., core layer 920 in FIG. 12).

The dielectric layer 102 includes a first surface 102a and a second surface 102b opposite to the first surface 102a. The first surface 102a is an outermost surface of the dielectric layer 102 at the top of the redistribution layer structure 100. The dielectric layer 102 defines one or more trenches 108, 108a, 108_1, 108a1. The trenches 108, 108a, 108_1, 108a1 are recessed from the first surface 102a. The trench 108 includes side surfaces 108b and a bottom surface 108c. The trenches 108a, 108_1, 108a1 similarly have side and bottom surfaces (not numbered). The trenches 108a, 108a1 extend through the dielectric layer 102. The trench 108a includes an upper portion 1081 and a lower portion 1082. The upper portion 1081 is in communication with the lower portion 1082, a size of the upper portion 1081 is greater than a size of the lower portion 1082, and the lower portion 1082 exposes the pad 1031 of the carrier 103. The trench 108a1 includes a single portion extending through the dielectric layer 102. Each of the trenches 108, 108a, 108_1, 108a1 may serve as a bonding pad, a trace, a via, or a combination thereof. The dielectric layer 102 may be an organic insulating layer, the material of which includes, for example, one of, or a combination of, an epoxy and a polyimide (PI). In one or more embodiments, a portion of the dielectric layer 102 that defines the trenches 108, 108a, 108_1, 108a1 is treated to be hydrophilic. In the embodiment illustrated in FIG. 1, the dielectric layer 102 is a single-layered structure; however, in other embodiments, the dielectric layer 102 includes two or more layers, and the same or different materials may be used in the different layers.

The anti-plating layer 104 is disposed adjacent to the first surface 102a of the dielectric layer 102. In the embodiment illustrated in FIG. 1, the anti-plating layer 104 is disposed on and contacts at least a portion of the first surface 102a of the dielectric layer 102 (i.e., the outermost surface of the dielectric layer 102), and is not disposed within the trenches 108, 108a, 108_1, 108a1. That is, for example, the anti-plating layer 104 is not disposed on the bottom surface 108c or the side surfaces 108b of the trenches 108, and the anti-plating layer 104 is not disposed in the upper portion 1081 and the lower portion 1082 of the trench 108a. The anti-plating layer 104 defines one or more openings 104a corresponding to the trenches 108, 108a, 108_1, 108a1. The size and position of the openings 104a are the same as the size and position of the respective trenches 108, 108a, 108_1, 108a1.

The anti-plating layer 104 may be hydrophobic. A hydrophobic property of the anti-plating layer 104 may be correlated with a water contact angle of the anti-plating layer 104. In one or more embodiments, the anti-plating layer 104 has a water contact angle of greater than or equal to about 80°, such as greater than or equal to about 90°, greater than or equal to about 95°, or greater than or equal to about 100°. The anti-plating layer 104 may include a material, such as, for example, one of, or a combination of, silicon dioxide, silicon nitride, a poly(p-xylylene) polymer (e.g., parylene-N, parylene-C, parylene-D, and parylene-AF4), and other hydrophobic ceramics or polymers.

It is noted that the anti-plating layer 104 is used to prevent the dielectric layer 102 from being plated by a metal, and in the final product of the redistribution layer structure 100, the anti-plating layer 104 remains on the dielectric layer 102. By disposing the anti-plating layer 104 on the first surface 102a of the dielectric layer 102, electric properties and stability of the redistribution layer structure 100 may be improved, because the anti-plating layer 104 can exhibit lower dielectric constant, lower dissipation factor, and improved acid and alkali-resistance properties relative to the material of the dielectric layer 102.

The conductive material 106 is disposed in the trenches 108, 108a, 108_1, 108a1, and is formed by, for example, plating. The conductive material 106 may cover a portion of, most of, or substantially all of, the trenches 108, 108a, 108_1, 108a1. For example, in one or more embodiments, the conductive material 106 covers a portion of the bottom surface 108c of the trench 108 without covering a remaining portion of the bottom surface 108c, and without extending onto the side surfaces 108b of the trench 108; and in other embodiments, the conductive material 106 covers a portion of, or all of, the bottom surface 108c and a portion of the side surfaces 108b of the trench 108. In addition, the conductive material 106 may fill the trench 108 or may define an opening 107 within the trench 108. For example, in the embodiment illustrated in FIG. 1, the conductive material 106 conforms to the shape of the trench 108 and defines an opening 107. The opening 107 may provide a space to accommodate a portion of a connecting element, for example, a solder, a metal pillar or a metal bump, and prevent the connecting element from overflowing during a reflow process and causing a bump bridge.

The conductive material 106 is disposed on the pad 1031 of the carrier 103. In one or more embodiments, the conductive material 106 is further disposed on the lower portion 1082 of the trench 108a, and may further be disposed on the upper portion 1081 of the trench 108a. In the embodiment illustrated in FIG. 1, the conductive material 106 conforms to the shape of the trench 108a and contacts the pad 1031 of the carrier 103. In addition, the conductive material 106 may fill the trench 108a or may define an opening within the trench 108a. The conductive material 106 is disposed in the trenches 108_1 and 108a1, and may be conformed to one or more of the trenches 108_1 or 108a1 (as illustrated in FIG. 1), and may fill one or more of the trenches 108_1 and 108a1 (not shown in FIG. 1). The conductive material 106 extends to the second surface 102b of the dielectric layer 102 in the trench 108a1, and may contact a pad or other portion of the carrier 103.

The conductive material 106 may or may not contact the anti-plating layer 104. In the embodiment illustrated in FIG. 1, the conductive material 106 is a single layer of metal, and does not contact the anti-plating layer 104. The conductive material 106 includes, for example, one of, or a combination of, palladium, copper, and nickel, or another metal, combination of metals, or a metal alloy. In one or more embodiments, a thickness of the conductive material 106 is greater than or equal to about 100 nm, greater than or equal to about 200 nm, greater than or equal to about 300 nm, greater than or equal to about 400 nm, greater than or equal to about 500 nm, or greater than or equal to about 1 µm.

Figure 2:
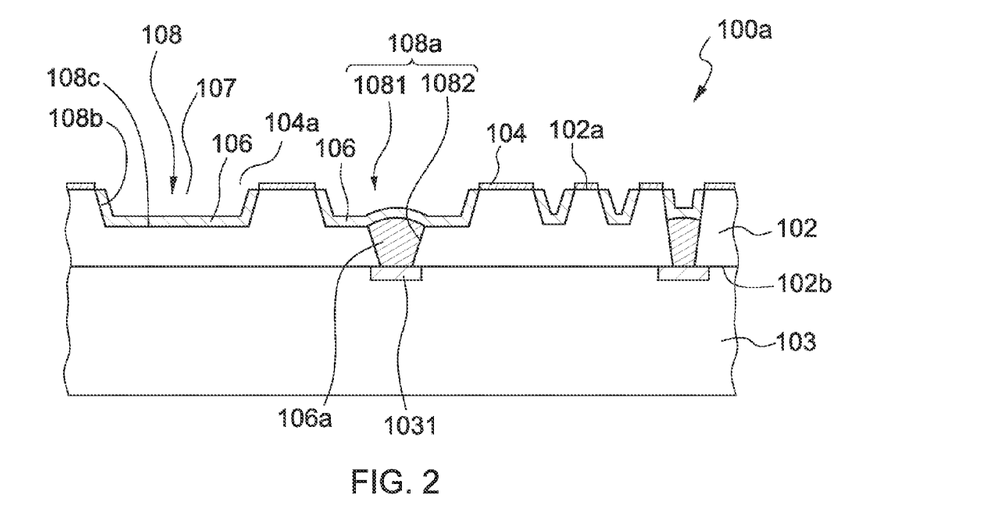
FIG. 2 illustrates a cross-sectional view of a redistribution layer structure according to an embodiment of the present disclosure.

FIG. 2 illustrates a cross-sectional view of a redistribution layer structure 100a according to an embodiment of the present disclosure. The redistribution layer structure 100a of the embodiment illustrated in FIG. 2 is similar to the redistribution layer structure 100 illustrated in FIG. 1, except that the lower portion 1082 of the trench 108a is filled with an interconnection metal 106a to form a conductive via, and the conductive material 106 covers and contacts the interconnection metal 106a.

Figure 3:
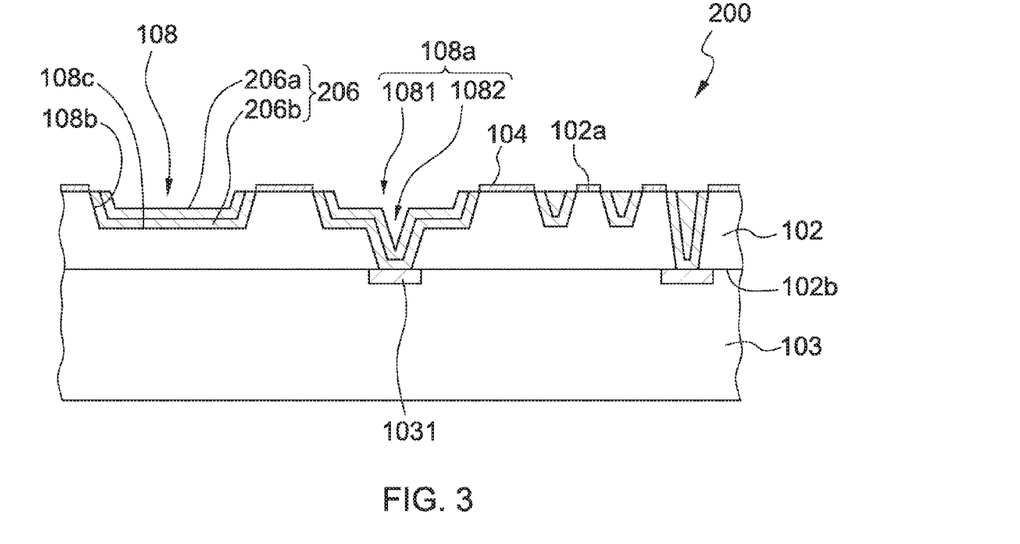
FIG. 3 illustrates a cross-sectional view of a redistribution layer structure according to an embodiment of the present disclosure.

FIG. 3 illustrates a cross-sectional view of a redistribution layer structure 200 according to an embodiment of the present disclosure. The redistribution layer structure 200 of the embodiment illustrated in FIG. 3 is similar to the redistribution layer structure 100 illustrated in FIG. 1, except that, rather than the single layer of conductive material 106 in FIG. 1, a conductive material 206 as illustrated in FIG. 3 includes a first conductive layer 206a and a second conductive layer 206b. Each of the first conductive layer 206a and the second conductive layer 206b may include, for example, one of, or a combination of, palladium, copper and nickel. In one or more embodiments, the first conductive layer 206a includes copper and the second conductive layer 206b includes nickel, and in other embodiments, the first conductive layer 206a includes nickel and the second conductive layer 206b includes copper. In one or more embodiments in which the dielectric layer 102 includes polyimide, the second conductive layer 206b includes nickel, so that the conductive material 206 can strongly adhere to the dielectric layer 102 and will not readily peel off; in addition, the nickel layer serves as a barrier layer when a solder bump of a die is joined to the conductive material 206, so that the joint between the solder bump and the conductive material 206 is improved. Although two layers are illustrated in FIG. 3 for the conductive material 206, the conductive material 206 may include more than two layers.

Figure 4:
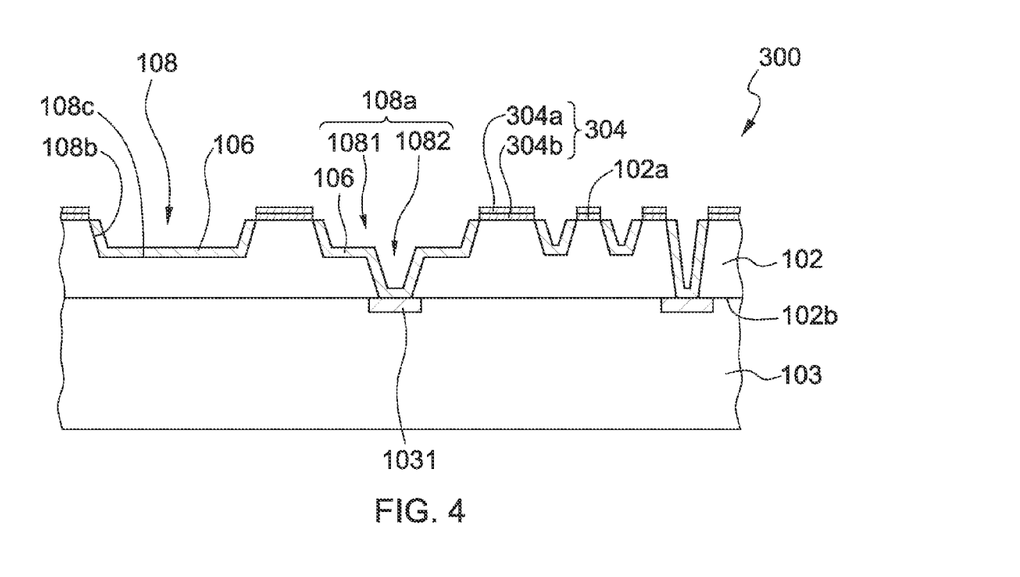
FIG. 4 illustrates a cross-sectional view of a redistribution layer structure according to an embodiment of the present disclosure.

FIG. 4 illustrates a cross-sectional view of a redistribution layer structure 300 according to an embodiment of the present disclosure. The redistribution layer structure 300 of the embodiment illustrated in FIG. 4 is similar to the redistribution layer structure 100 illustrated in FIG. 1, except that, rather than the anti-plating layer 104 of FIG. 1, an anti-plating layer 304 as illustrated in FIG. 4 includes a first anti-plating layer 304a and a second anti-plating layer 304b. Each of the first anti-plating layer 304a and the second anti-plating layer 304b may include, for example, one of, or a combination of, silicon dioxide, silicon nitride, parylene-N, parylene-C, parylene-D, and parylene-AF4. In one or more embodiments, one of the first anti-plating layer 304a and the second anti-plating layer 304b includes one of, or a combination of, silicon dioxide and silicon nitride, and the other of the anti-plating layers 304a, 304b includes one of, or a combination of, parylene-N, parylene-C, parylene-D, and parylene-AF4. Although two anti-plating layers 304a, 304b are illustrated in FIG. 4, the anti-plating layer 304 may include more than two layers.

Figure 5:
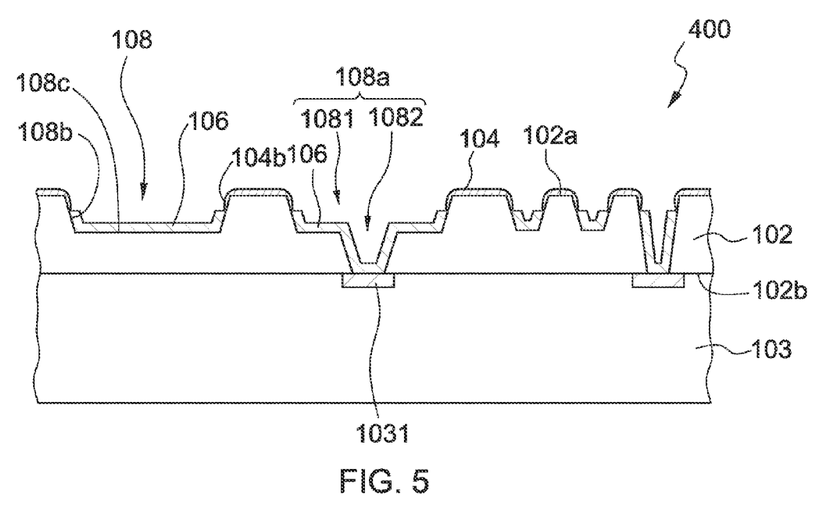
FIG. 5 illustrates a cross-sectional view of a redistribution layer structure according to an embodiment of the present disclosure.

FIG. 5 illustrates a cross-sectional view of a redistribution layer structure 400 according to an embodiment of the present disclosure. The redistribution layer structure 400 of the embodiment illustrated in FIG. 5 is similar to the redistribution layer structure 100 illustrated in FIG. 1, except that a portion 104b of the anti-plating layer 104 illustrated in FIG. 5 is disposed on the side surfaces 108b of the trench 108, and on side surfaces of the trenches 108_1, 108a, 108a1. That is, the anti-plating layer 104 extends into the trenches 108, 108a, 108_1, 108a1. In embodiments in which the anti-plating layer 104 is a thermoplastic material which includes one of, or a combination of, parylene-N, parylene-C, parylene-D, and parylene-AF4, the anti-plating layer 104 may melt during a high temperature laser drilling process, and the portion 104b of the anti-plating layer 104 may flow along the side surfaces 108b of the trench 108, and on side surfaces of the trenches 108a, 108_1, 108a1. Thus, a thickness of the anti-plating layer 104 on the side surfaces of the trenches (e.g., side surfaces 108b) is less than a thickness of the anti-plating layer 104 on the first surface 102a of the dielectric layer 102. The portion 104b of the anti-plating layer 104 on the side surfaces (e.g., side surfaces 108b) of the trenches 108, 108a, 108_1, 108a1, may increase an isolation effect between the trenches 108, 108a, 108_1, 108a1, because the portion 104b can prevent the conductive material 106 from extending beyond the trenches 108, 108a, 108_1, 108a1. That is, a top end of the conductive material 106 in FIG. 5 is lower than a top end of the conductive material 106 in FIG. 1, and the conductive material 106 in one trench 108, 108a, 108_1, 108a1 will not contact the conductive material 106 in an adjacent trench 108, 108a, 108_1, 108a1.

Figure 6:
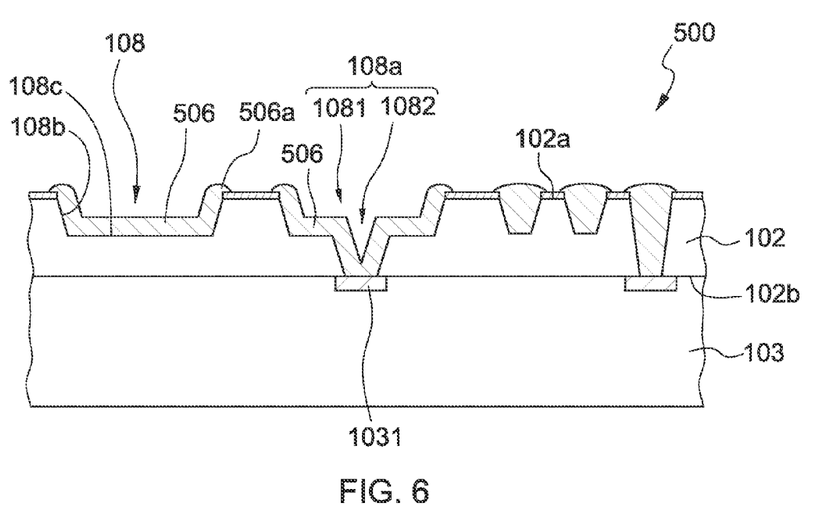
FIG. 6 illustrates a cross-sectional view of a redistribution layer structure according to an embodiment of the present disclosure.

FIG. 6 illustrates a cross-sectional view of a redistribution layer structure 500 according to an embodiment of the present disclosure. The redistribution layer structure 500 of the embodiment illustrated in FIG. 6 is similar to the redistribution layer structure 100 illustrated in FIG. 1, except that a portion 506a of the conductive material 506 illustrated in FIG. 6 extends beyond the trenches 108, 108a, 108_1, 108a1. In one or more embodiments, the portion 506a of the conductive material 506 extends beyond the trenches 108, 108a, 108_1, 108a1 and is disposed on the anti-plating layer 104. The extended portion 506a of the conductive material 506 may help to confine a connecting element, for example, a solder, a metal pillar or a metal bump, and prevent it from overflowing during the reflow process and causing a bump bridge. In one or more embodiments, the conductive material 506 fills one or more trenches 108, 108a, 108_1, 108a1; as illustrated in FIG. 6, trenches 108_1 and 108a1 are filled with the conductive material 506.

The conductive material 506 may include, for example, one of, or a combination of, palladium, copper and nickel. Although one layer is illustrated in FIG. 6 for the conductive material 506, the conductive material 506 may include more than one layer.

Figure 7:
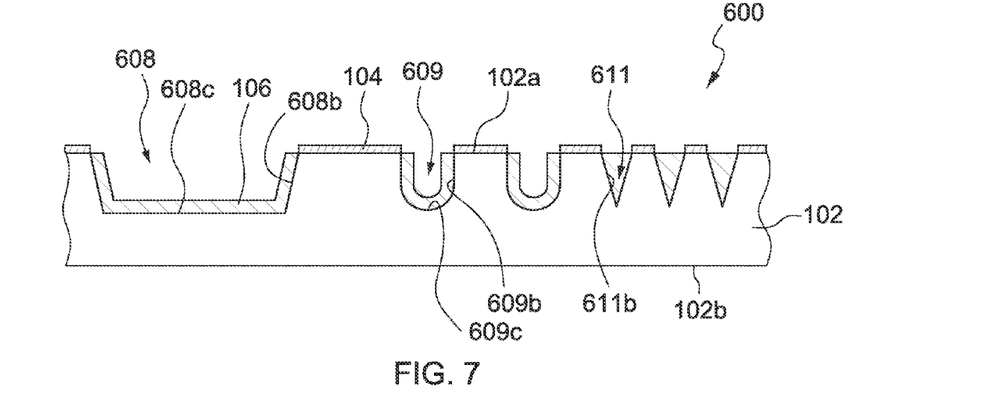
FIG. 7 illustrates a cross-sectional view of a redistribution layer structure according to an embodiment of the present disclosure.

FIG. 7 illustrates a cross-sectional view of a redistribution layer structure 600 according to an embodiment of the present disclosure. The redistribution layer structure 600 illustrates that trenches (e.g., the trenches 108, 108a, 108_1, 108a1) may have different cross-sectional shapes. By way of example, trench 609 is illustrated as having a U-shaped cross section, whereas trenches 611 are illustrated as having V-shaped cross-sections. More generally, any of the trenches 608, 609, 611 (or the trenches 108, 108a, 108_1, 108a1) may have a cross-sectional shape of trapezoid (e.g., as illustrated for trench 608 and similarly for trench 108 of FIG. 1), U, semi-circle, or V. The trench 609 includes flat side surfaces 609b and a curved bottom surface 609c; and the side surfaces 611b of the trench 611 intersect at a bottom end of the trench 611. A size (e.g., a volume or a diameter) of the V shaped trench 611 is smaller than a size of the U shaped trench 609, and the size of the U shaped trench 609 is smaller than a size of the trapezoid shaped trench 608.

Figure 8:
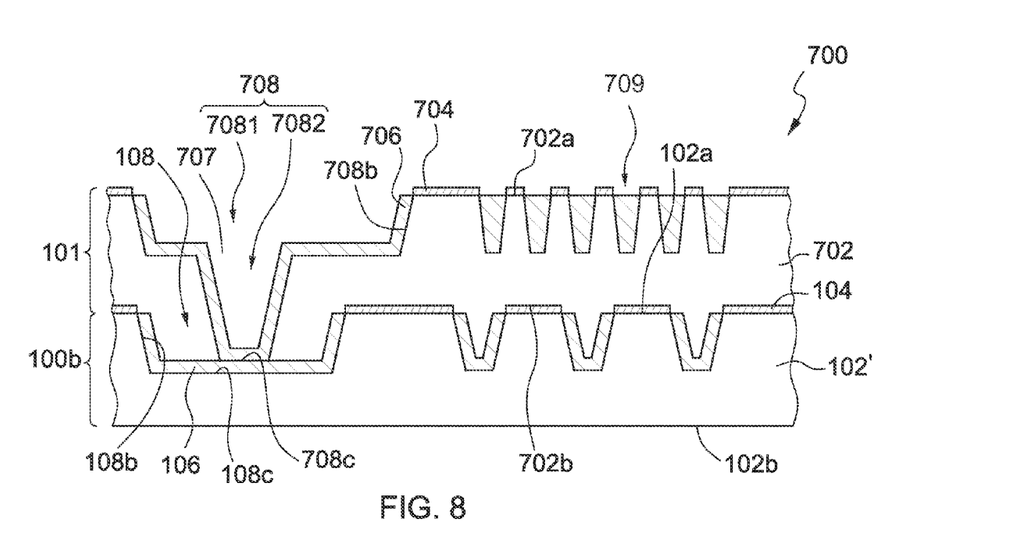
FIG. 8 illustrates a cross-sectional view of a redistribution layer structure according to an embodiment of the present disclosure.

FIG. 8 illustrates a cross-sectional view of a redistribution layer structure 700 according to an embodiment of the present disclosure. The redistribution layer structure 700 of the embodiment illustrated in FIG. 8 includes a first redistribution layer structure 100b and a second redistribution layer structure 101 disposed above the first redistribution layer structure 100b. The first redistribution layer structure 100b illustrated in FIG. 8 is similar in some ways to the redistribution layer structure 100 illustrated in FIG. 1 with the carrier 103 omitted. The first redistribution layer structure 100b includes a lower dielectric layer 102', similar to the dielectric layer 102 of FIG. 1.

In one or more embodiments, the second redistribution layer structure 101 includes an upper dielectric layer 702, an upper anti-plating layer 704, and an upper conductive material 706.

The upper dielectric layer 702 is disposed on the anti-plating layer 104 of the first redistribution layer structure 100b. Therefore, the upper dielectric layer 702 contacts the anti-plating layer 104 rather than the dielectric layer 102'. The upper dielectric layer 702 includes a first surface 702a and a second surface 702b, and defines one or more upper trenches 708, 709. In the embodiment illustrated in FIG. 8, the upper trench 708 includes side surfaces 708b, a bottom surface 708c, an upper portion 7081 and a lower portion 7082. The first surface 702a is an outermost surface of the upper dielectric layer 702 at the top of the upper dielectric layer 702. The upper trenches 708, 709 may serve as bonding pads, traces, vias, or a combination thereof. The upper dielectric layer 702 may be an organic insulating layer, the material of which includes, for example, one of, or a combination of, an epoxy and a polyimide (PI). The material of the upper dielectric layer 702 may be the same as or different from a material of the dielectric layer 102'.

The upper anti-plating layer 704 is disposed adjacent to the first surface 702a of the upper dielectric layer 702. The upper anti-plating layer 704 is disposed on and contacts at least a portion of the first surface 702a (the outermost surface) of the upper dielectric layer 702, and is not disposed within the upper trenches 708, 709. The material of the upper anti-plating layer 704 may be the same as or different from a material of the anti-plating layer 104 described above.

The upper conductive material 706 is disposed in the upper trenches 708, 709. The upper conductive material 706 may cover a portion of, most of, or substantially all of, the upper trench 708. In one or more embodiments, the upper conductive material 706 covers a portion of the bottom surface 708c of the trench 708 and does not extend onto the side surfaces of the upper trenches 708, 709 (e.g., the side surfaces 708b of the upper trench 708); in other embodiments, the upper conductive material 706 covers a portion of the bottom surface 708c and at least a portion of the side surfaces of the upper trenches 708, 709 (e.g., the side surfaces 708b of the upper trench 708). In addition, the upper conductive material 706 may fill the upper trench 708 or define an opening 707 in the upper trench 708, or fill the upper trenches 709 or define openings in the upper trenches 709. In the embodiment illustrated in FIG. 8, the upper conductive material 706 conforms to a shape of the upper trench 708 and defines an opening 707. The opening 707 may provide a space to accommodate a portion of a connecting element, for example, a bump, and prevent it from overflowing during a reflow process and causing a bump bridge.

The upper conductive material 706 is electrically connected to the conductive material 106 of the first redistribution layer structure 100. In one or more embodiments, the upper conductive material 706 contacts the conductive material 106 directly within the upper trench 708; and in other embodiments, the upper conductive material 706 is electrically connected to the conductive material 106 through a conductive via (not shown). As illustrated in FIG. 8, the upper conductive material 706 does not contact the upper anti-plating layer 704. A material of the upper conductive material 706 may be the same as or different from that of the conductive material 106 described above, and a thickness of the upper conductive material 706 may be the same as or different from that of the conductive material 106 described above.

Figure 9:
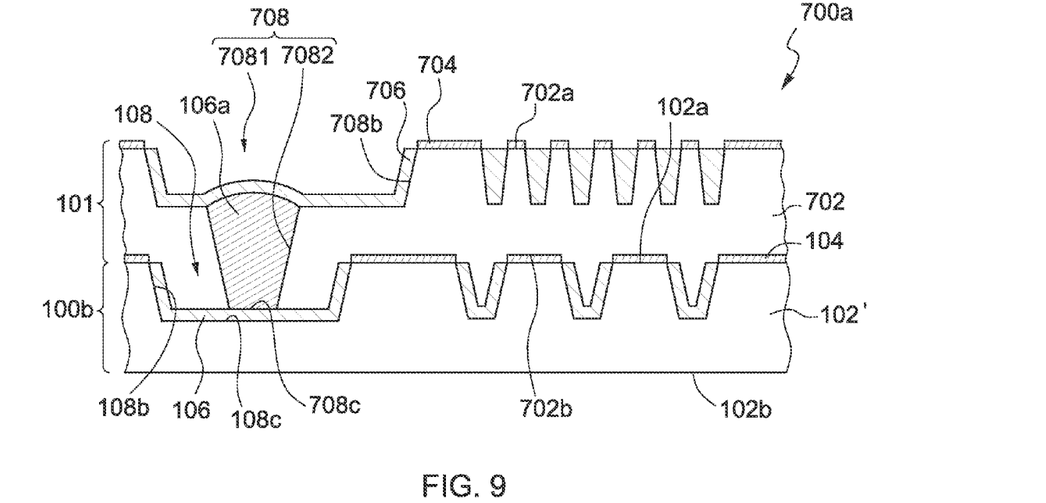
FIG. 9 illustrates a cross-sectional view of a redistribution layer structure according to an embodiment of the present disclosure.

FIG. 9 illustrates a cross-sectional view of a redistribution layer structure 700a according to an embodiment of the present disclosure. The redistribution layer structure 700a of the embodiment illustrated in FIG. 9 is similar to the redistribution layer structure 700 illustrated in FIG. 8, except that the lower portion 7082 of the trench 708 is filled with an interconnection metal 106a to form a conductive via, and the upper conductive material 706 covers and contacts the interconnection metal 106a.

Figure 10:
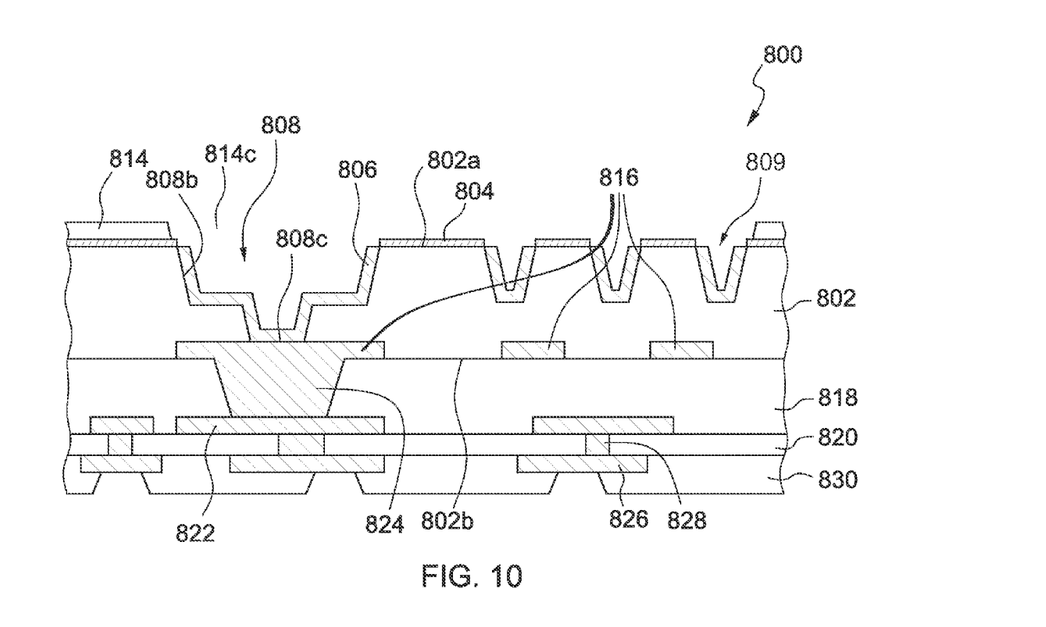
FIG. 10 illustrates a cross-sectional view of a semiconductor substrate structure according to an embodiment of the present disclosure.

FIG. 10 illustrates a cross-sectional view of a semiconductor substrate structure 800 according to an embodiment of the present disclosure. The semiconductor substrate structure 800 is a coreless substrate, which includes an upper dielectric layer 802, an anti-plating layer 804, a conductive material 806, a first patterned conductive layer 816 and a top protection layer 814.

The upper dielectric layer 802 is similar to the dielectric layer 102 illustrated in FIG. 1. The upper dielectric layer 802 includes a first surface 802a and a second surface 802b opposite to the first surface 802a, and defines one or more trenches 808, 809. The trench 808 is recessed from the first surface 802a, and includes side surfaces 808b and a bottom surface 808c. The upper dielectric layer 802 may be an organic insulating layer, the material of which includes, for example, one of, or a combination of, an epoxy and a polyimide (PI). A material of the upper dielectric layer 802 may be the same as or different from the material of the dielectric layer 102 (FIG. 1).

The anti-plating layer 804 is similar to the anti-plating layer 104 illustrated in FIG. 1, and is disposed on and contacts the first surface 802a of the upper dielectric layer 802, and is not disposed within the trenches 808, 809. A material of the anti-plating layer 804 may be the same as or different from the material of the anti-plating layer 104 described above. The conductive material 806 is similar to the conductive material 106 illustrated in FIG. 1, and is disposed in the trenches 808, 809. A material of the conductive material 806 may be the same as or different from the material of the conductive material 106 described above.

The top protection layer 814 is, for example, a solder mask that is disposed on the anti-plating layer 804. The top protection layer 814 defines an opening 814c to expose the conductive material 806.

The first patterned conductive layer 816 is electrically connected to the conductive material 806 disposed in the trench 808. In the embodiment illustrated in FIG. 10, the first patterned conductive layer 816 is embedded in the upper dielectric layer 802 and is exposed from the second surface 802b of the upper dielectric layer 802. The first patterned conductive layer 816 contacts the conductive material 806 directly in this embodiment.

In the embodiment illustrated in FIG. 10, the semiconductor substrate structure 800 further includes a first dielectric layer 818, a second dielectric layer 820, a second patterned conductive layer 822, a first via 824, a third patterned conductive layer 826, a second via 828 and a bottom protection layer 830. The first dielectric layer 818 is disposed on the second surface 802b of the upper dielectric layer 802. The second patterned conductive layer 822 is embedded in the first dielectric layer 818, and is exposed from a bottom surface of the first dielectric layer 818. The first via 824 is disposed in the first dielectric layer 818, and connects the first patterned conductive layer 816 and the second patterned conductive layer 822. The second dielectric layer 820 is disposed on the bottom surface of the first dielectric layer 818. The third patterned conductive layer 826 is disposed on a bottom surface of the second dielectric layer 820. The second via 828 is disposed in the second dielectric layer 820, and connects the second patterned conductive layer 822 and the third patterned conductive layer 826. The bottom protection layer 830 is disposed on the bottom surface of the second dielectric layer 820, and defines one or more openings to expose the third patterned conductive layer 826.

Figure 11:
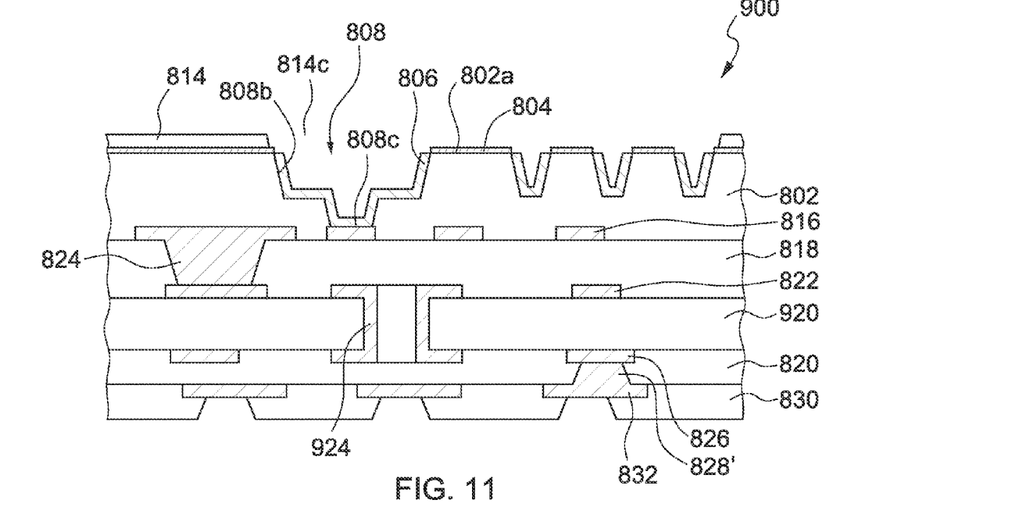
FIG. 11 illustrates a cross-sectional view of a semiconductor substrate structure according to an embodiment of the present disclosure.

FIG. 11 illustrates a cross-sectional view of a semiconductor substrate structure 900 according to an embodiment of the present disclosure. Portions of the semiconductor substrate structure 900 of the embodiment illustrated in FIG. 11 are similar to the semiconductor substrate structure 800 illustrated in FIG. 10. For example, the anti-plating layer 804, the conductive material 806, the dielectric layers 802, 818, 820, the patterned conductive layers 816, 822, 826, the first via 824, the protection layers 814, 830, and the trenches 808, 809 of the semiconductor substrate structure 900 illustrated in FIG. 11 are at least similar to the correspondingly-numbered components in the semiconductor substrate structure 800 illustrated in FIG. 10. The semiconductor substrate structure 900 includes a core layer 920. A material of the core layer 920 may be an organic material including, for example, a glass fiber, silicon (Si) or silicon dioxide ($SiO_2$) dispersed in the organic material. The first dielectric layer 818 and the second patterned conductive layer 822 are disposed on a top surface of the core layer 920. The upper dielectric layer 802 and the first patterned conductive layer 816 are disposed on the first dielectric layer 818. The second dielectric layer 820 and the third patterned conductive layer 826 are disposed on a bottom surface of the core layer 920. A core via 924 is disposed in the core layer 920, and connects the second patterned conductive layer 822 and the third patterned conductive layer 826. The bottom protection layer 830 and the fourth patterned conductive layer 832 are disposed on the bottom surface of the second dielectric layer 820. The bottom protection layer 830 defines one or more openings to expose the fourth patterned conductive layer 832. A second via 828' is disposed in the second dielectric layer 820, and connects the third patterned conductive layer 826 and the fourth patterned conductive layer 832.

Figure 12:
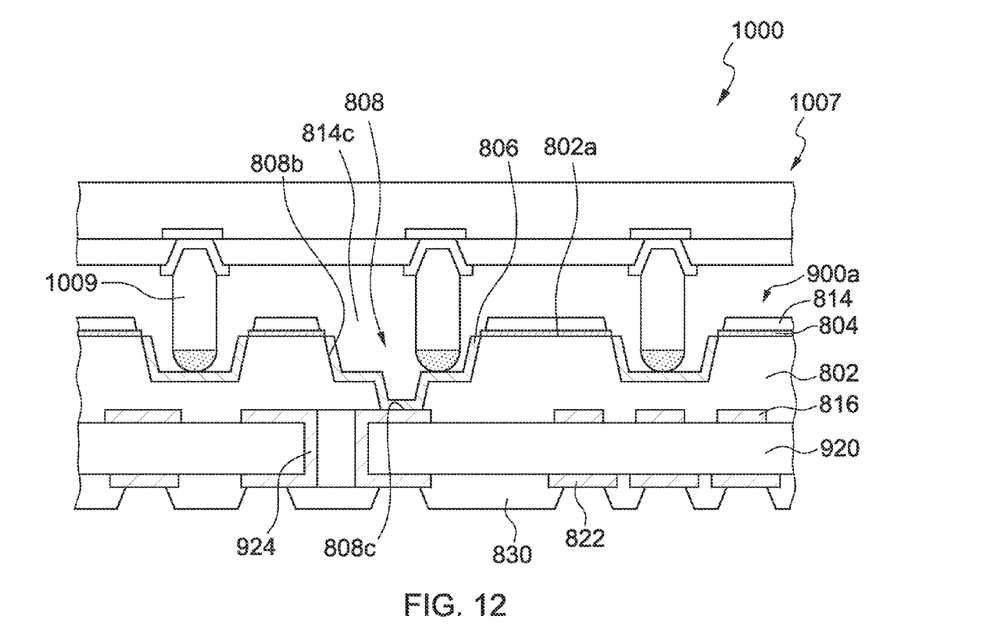
FIG. 12 illustrates a cross-sectional view of a semiconductor package structure according to an embodiment of the present disclosure.

FIG. 12 illustrates a cross-sectional view of a semiconductor package structure 1000 according to an embodiment of the present disclosure. The semiconductor package structure 1000 includes a semiconductor substrate structure 900a and a semiconductor element 1007. The semiconductor substrate structure 900a is in some ways similar to the semiconductor substrate structure 900 illustrated in FIG. 11. For example, the anti-plating layer 804, the conductive material 806, the upper dielectric layer 802, the patterned conductive layers 816, 822, the protection layers 814, 830, the trenches 808, 809, the core layer 920, and the core via 924 of the semiconductor substrate structure 900a illustrated in FIG. 12 are at least similar to the correspondingly-numbered components in the semiconductor substrate structure 900 illustrated in FIG. 11. The first dielectric layer 818 and the second dielectric layer 820 of FIG. 11 are omitted in the embodiment of FIG. 12. The upper dielectric layer 802 and the first patterned conductive layer 816 are disposed on the top surface of the core layer 920. The upper dielectric layer 802 defines at least one trench 808. The anti-plating layer 804 is disposed on a top surface of the upper dielectric layer 802. The conductive material 806 is disposed in the trench 808. The first patterned conductive layer 816 is disposed below the conductive material 806, and is electrically and physically connected to the conductive material 806. The second patterned conductive layer 822 and the bottom protection layer 830 are disposed on the bottom surface of the core layer 920. The core via 924 is disposed in the core layer 920, and connects the first patterned conductive layer 816 and the second patterned conductive layer 822.

The semiconductor element 1007 is electrically connected to the semiconductor substrate structure 900a. In one or more embodiments, the semiconductor element 1007 is electrically connected to the first patterned conductive layer 816 through at least one connecting element 1009, for example, a solder, a metal pillar or a metal bump. The semiconductor element 1007 may be, for example, a chip, a package, or an interposer.

Figure 13:
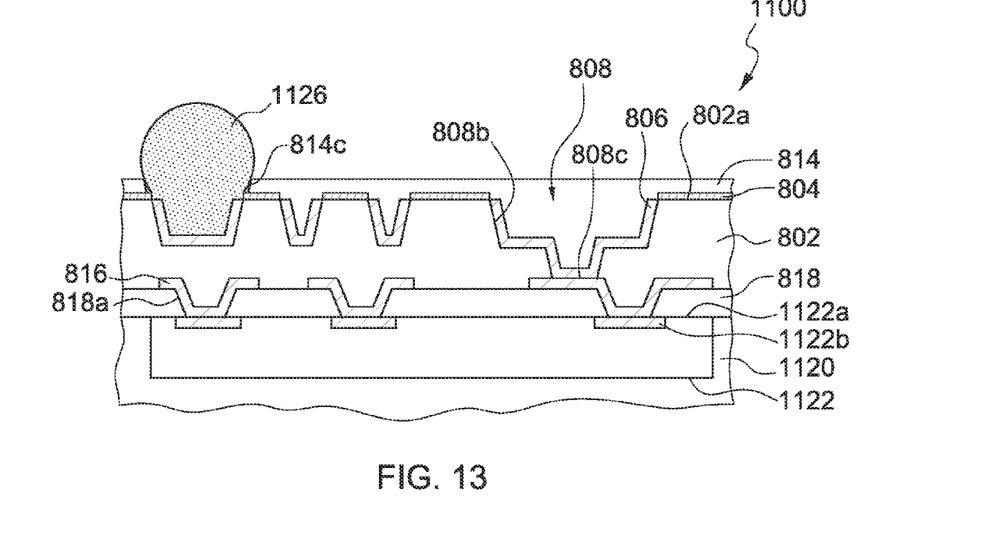
FIG. 13 illustrates a cross-sectional view of a chip structure according to an embodiment of the present disclosure.

FIG. 13 illustrates a cross-sectional view of a chip structure 1100 according to an embodiment of the present disclosure. The chip structure 1100 includes a die 1122, an upper dielectric layer 802, an anti-plating layer 804, a conductive material 806, a first patterned conductive layer 816, a connecting element 1126, a first dielectric layer 818, an isolation layer 1120 and a top protection layer 814.

The die 1122 includes a first surface 1122a and a plurality of die pads 1122b disposed on the first surface 1122a. The die 1122 is embedded in the isolation layer 1120, and the first surface 1122a and the die pads 112 are exposed from a top surface of the isolation layer 1120. The first dielectric layer 818 covers the die 1122 and the isolation layer 1120, and defines through holes 818a corresponding to the die pads 1122b. The first patterned conductive layer 816 is disposed on the first dielectric layer 818 and in the through holes 818a to contact the die pads 1122b. The upper dielectric layer 802 is disposed on the first dielectric layer 818. The upper dielectric layer 802 defines at least one trench 808. The anti-plating layer 804 is disposed on a top surface of the upper dielectric layer 802. The conductive material 806 is disposed in the trench 808 to contact the first patterned conductive layer 816. Thus, the conductive material 806 is electrically connected to the die 1122. The top protection layer 814 is, for example, a solder mask, that is disposed on the anti-plating layer 804. The top protection layer 814 defines an opening 814c to expose the conductive material 806. The connecting element 1126, for example, solder, metal pillar or metal bump, is disposed on the conductive material 806 for external connection.

FIGS. 14A-14E illustrate a method of manufacturing a redistribution layer structure according to an embodiment of the present disclosure.

Figure 14A:
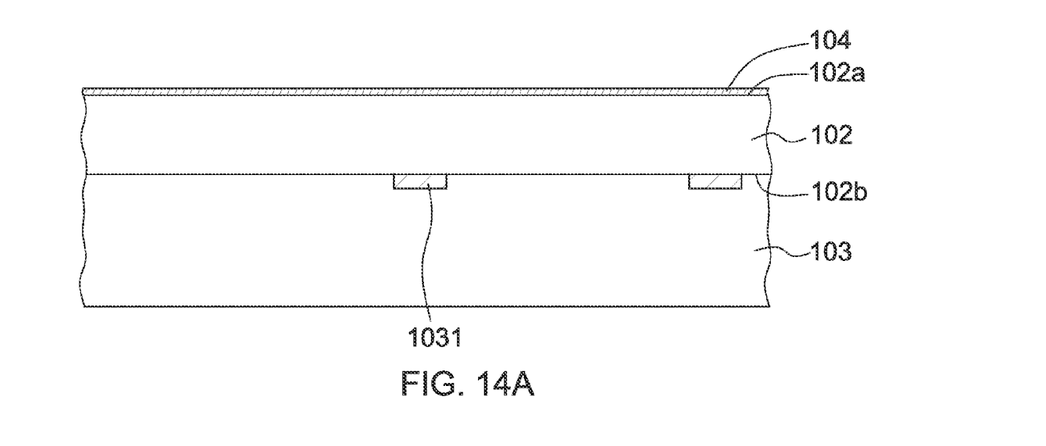
FIGS. 14A, 14B, 14C, 14D and 14E illustrate a method of manufacturing a redistribution layer structure according to an embodiment of the present disclosure.

Referring to FIG. 14A, an anti-plating layer 104 is formed on a first surface 102a of a dielectric layer 102. In one or more embodiments, the dielectric layer 102 is disposed on a carrier 103. The carrier 103 includes one or more pads 1031. The carrier 103 may be another dielectric layer or a core layer. The dielectric layer 102 may be an organic insulating layer, the material of which includes, for example, one of, or a combination of, an epoxy and a polyimide (PI). The anti-plating layer 104 may be hydrophobic. The hydrophobic property of the anti-plating layer 104 may correlate with a water contact angle of the anti-plating layer 104. In one or more embodiments, the anti-plating layer 104 has a water contact angle of greater than or equal to about 80°. The anti-plating layer 104 may include a material, such as, for example, one of, or a combination of, silicon dioxide, silicon nitride, parylene-N, parylene-C, parylene-D, and parylene-AF4. In one or more embodiments, the anti-plating layer 104 is formed on the first surface 102a by a physical vapor deposition method or a chemical vapor deposition method. A thickness of the anti-plating layer 104 is about 1000 Angstroms (Å) to about 2000 Å, such as about 1000 Å to 1500 Å, about 1200 Å to 1800 Å, or about 1500 Å to 2000 Å.

Figure 14B:
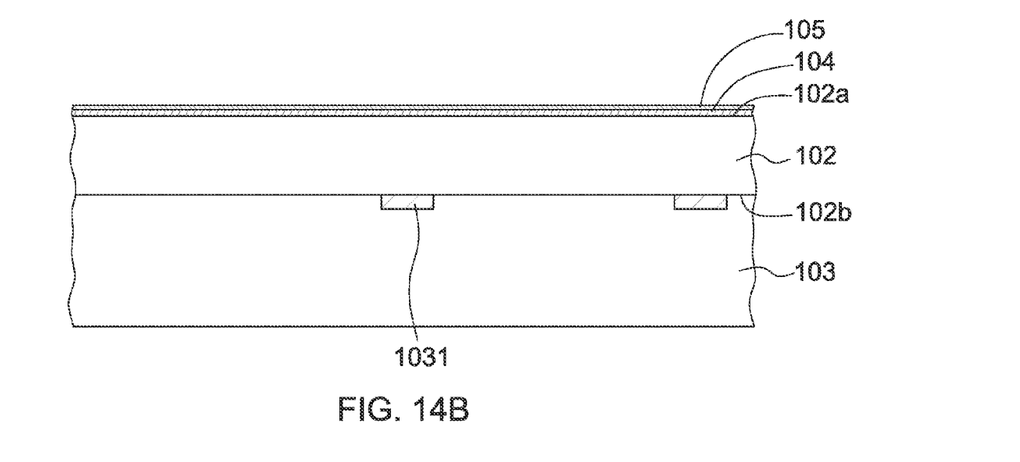

Referring to FIG. 14B, an additional layer 105 is formed on the anti-plating layer 104. In the embodiment illustrated in FIG. 14B, the additional layer 105 covers most of, or substantially all of, an upper surface of the anti-plating layer 104. In other embodiments, the additional layer 105 covers a portion of the upper surface of the anti-plating layer 104. In one or more embodiments, the additional layer 105 is an adhesive or a metal layer, the material of which can include, for example, aluminum or nickel. The thickness of the additional layer 105 is about 50 Å to about 80 Å, such as about 50 Å to about 60 Å, about 60 Å to about 70 Å, or about 70 Å to about 80 Å.

Figure 14C:
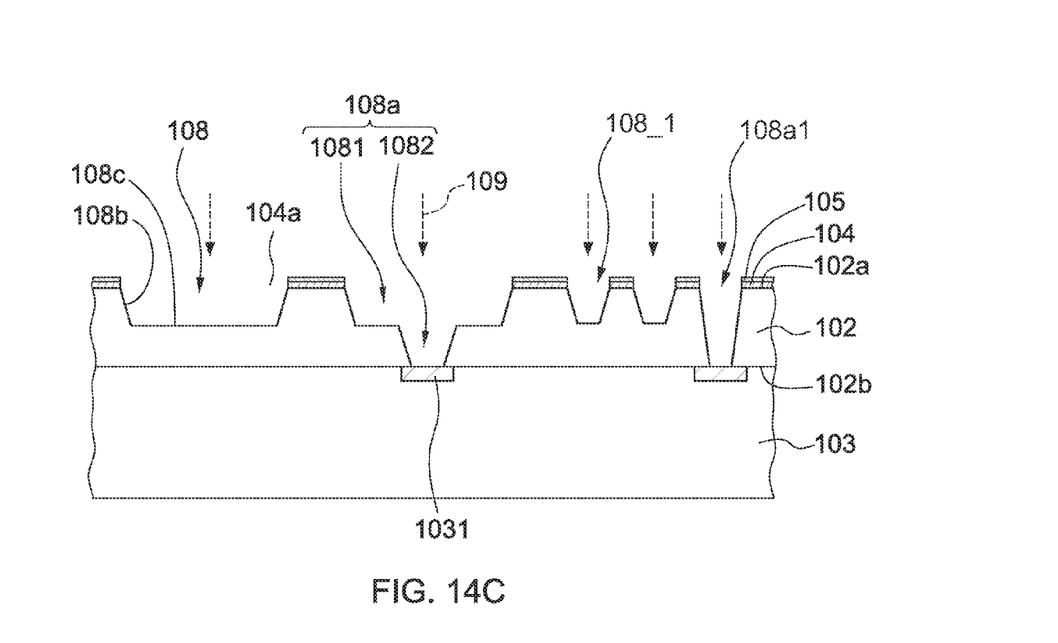

Referring to FIG. 14C, the first surface 102a of the dielectric layer 102, the anti-plating layer 104 and the additional layer 105 are ablated to form at least one opening 104a in the anti-plating layer 104 and at least one trench 108, 108a, 108_1, 108a1 in the dielectric layer 102. The openings 104a correspond to trenches 108, 108a, 108_1, 108a1. A size and position of the openings 104a are the same as respective trenches 108, 108a, 108_1, 108a1, because they are formed at the same time. The trench 108a extends through the dielectric layer 102, and includes an upper portion 1081 and a lower portion 1082. The upper portion 1081 is in communication with the lower portion 1082, a size of the upper portion 1081 is greater than a size of the lower portion 1082, and the lower portion 1082 exposes the pad 1031 of the carrier 103. The trench 108a1 extends through the dielectric layer 102 and exposes a portion of a top surface of the carrier 103. In one or more embodiments, the ablating process is performed by laser 109 (for example, an excimer laser or a UV laser); that is, by laser drilling. A pattern of the trenches 108, 108a, 108_1, 108a1 has a L/S (line/space width) ratio of less than or equal to 10 micrometers (μm)/10 μm, such as less than or equal to 5 μm/5 μm. Each trench 108, 108a, 108_1, 108a1 is recessed from the first surface 102a, and includes side surfaces (e.g., side surfaces 108b of trench 108) and a bottom surface (e.g., a bottom surface 108c of trench 108). In the embodiment illustrated in FIG. 14C, the anti-plating layer 104 is disposed on the first surface 102a of the dielectric layer 102 and not in the trenches 108, 108a, 108_1, 108a1. That is, the anti-plating layer 104 is not disposed on the bottom surfaces (e.g., 108c) or the side surfaces (e.g., 108b) of the trenches 108, 108a, 108_1, 108a1. However, in other embodiments, when the anti-plating layer 104 is a thermoplastic material which includes one of, or a combination of, parylene-N, parylene-C, parylene-D, and parylene-AF4, the anti-plating layer 104 may melt due to a high temperature during a laser drilling process; thus, a portion of the anti-plating layer 104 may flow along the side surfaces (e.g., 108b) of the trenches 108, 108a, 108_1, 108a1, as shown in FIG. 5.

Portions of the additional layer 105 will remain on the surface of the anti-plating layer 104. By providing the additional layer 105 on the anti-plating layer 104, dust generated during ablating or drilling could be adhered to the surface of the additional layer 105, rather than to the anti-plating layer 104, so the anti-plating layer 104 can perform its role of rejecting a plating.

Figure 14D:
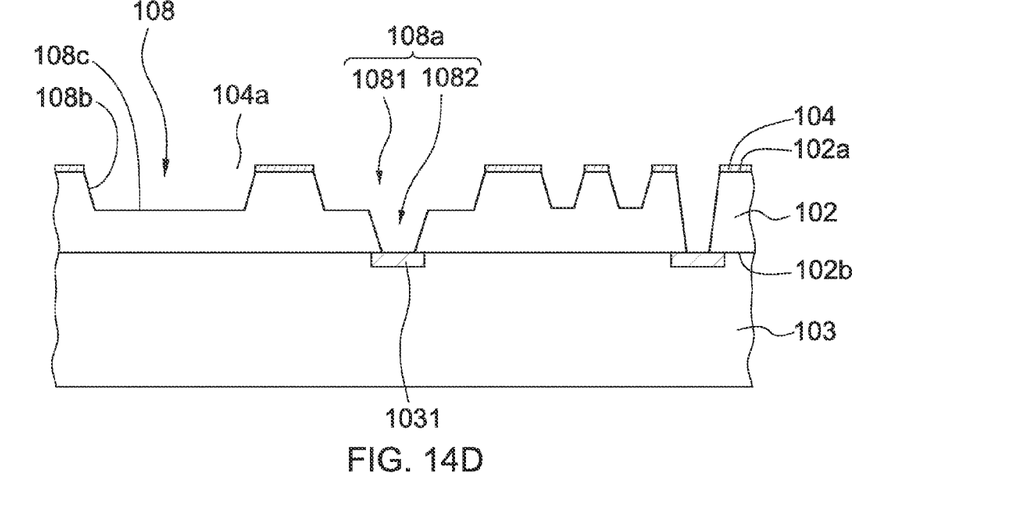

Referring to FIG. 14D, the remaining portions of the additional layer 105 are removed. Therefore, with the inclusion of the additional layer 105, dust generated during ablating or drilling can be removed easily, and circuit shorts caused by such dust can be reduced or eliminated. In one or more embodiments, the remaining portions of the additional layer 105 are removed by washing with an oscillator, for example, supersonic oscillator, and further etching with an acid or alkaline.

Figure 14E:
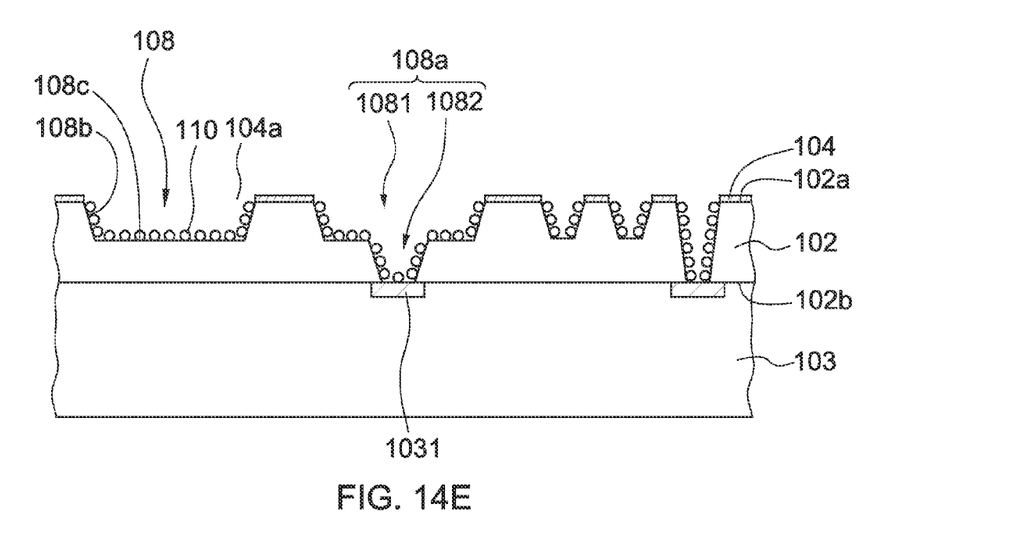

Referring to FIG. 14E, a portion of the dielectric layer 102 that defines the trenches 108, 108a, 108_1, 108a1 (e.g., the bottom surface 108c and the side surfaces 108b of the trench 108) is treated to become hydrophilic such that the hydrophilic portion can attract a metal catalyst, whereas the hydrophobic anti-plating layer 104 will repel the metal catalyst. Therefore, a selective plating can be carried out by attracting the metal catalyst to the dielectric layer 102 within the trenches 108, 108a, 108_1, 108a1 rather than to the surface of the anti-plating layer 104. As a result, the anti-plating layer 104 does not need to be removed. In one or more embodiments, the portion of the dielectric layer 102 defining the trenches 108, 108a, 108_1, 108a1 is treated with a strong oxidant, an alkaline compound, or a combination thereof, for example, a material selected from a group consisting of potassium hydroxide, sodium hydroxide, and nitric acid.

Then, the portion of the dielectric layer 102 defining the trenches 108, 108a, 108_1, 108a1 is seeded with a metal catalyst 110. In one or more embodiments, the metal catalyst 110 is palladium ions. As shown in FIG. 14E, the metal catalyst 110 is disposed in the trenches 108, 108a, but not on the anti-plating layer 104. Then, an electroless plating is conducted so that a conductive material (e.g., 106 in FIG. 1) is formed in the trenches 108, 108a, 108_1, 108a1. As a result, a redistribution layer structure 100 as illustrated in FIG. 1 is obtained. The conductive material includes, for example, one of, or a combination of, palladium, copper, and nickel. In the embodiment illustrated in FIG. 14E, the metal catalyst 110 with ion type is attached to the surface of the trenches 108, 108a by chemical bonding, which has a high bonding force. In comparison, a metal catalyst included in a gel and attached to the surface of the trenches 108, 108a, 108_1, 108a1 by physical adhesion has a low bonding force, such that an additional process stage may be used to make surfaces of the trenches 108, 108a, 108_1, 108a1 (e.g., the bottom surface 108c and the side surfaces 108b of the trench 108) rough to improve the adhesion between the metal catalyst 110 and the dielectric layer 102. In contrast, such additional process stage is not needed in the embodiment of FIG. 14E, and manufacturing cost can accordingly be reduced.

In an embodiment, if excess conductive material 106 is plated, the conductive material 106 may extend to a top surface of the anti-plating layer 104, as shown in FIG. 6.

In one or more embodiments, an upper dielectric layer 702 may be formed on the anti-plating layer 104. Further, an upper anti-plating layer 704 and an upper conductive material 706 may be formed on and in the upper dielectric layer 702, so as to form a second redistribution layer structure 101 on a redistribution layer structure 100b, as shown in FIG. 8.

Figure 15A:
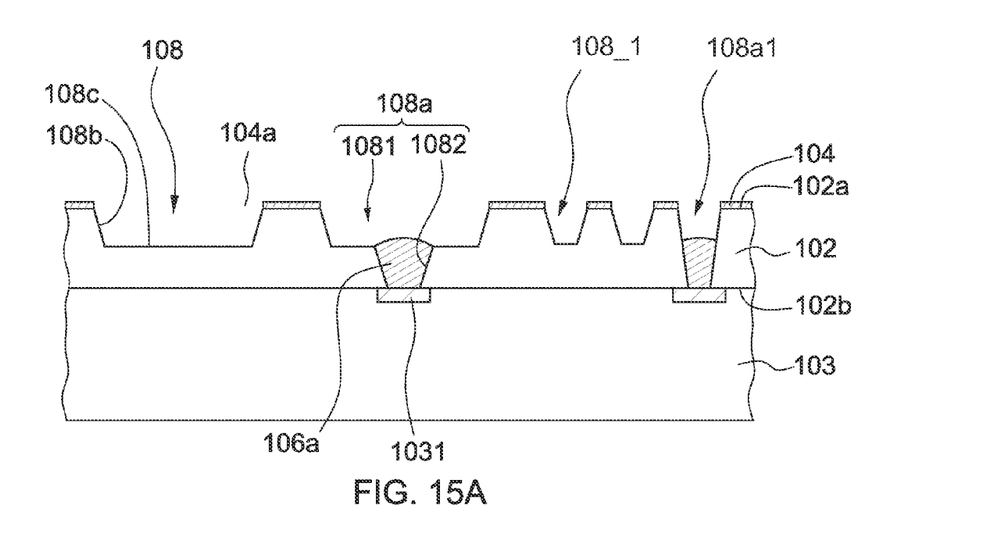
FIGS. 15A and 15B illustrate a method of manufacturing a redistribution layer structure according to an embodiment of the present disclosure.
Figure 15B:
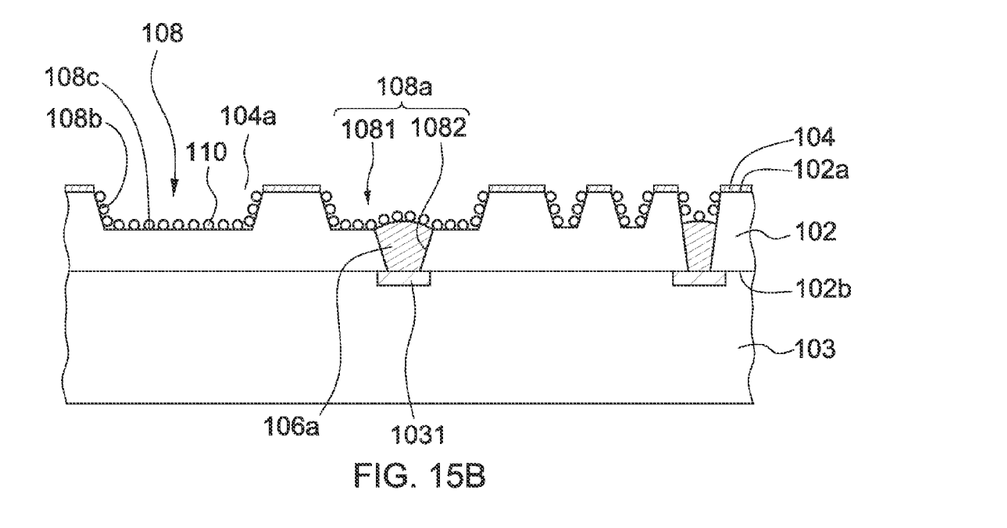

FIGS. 15A and 15B illustrate a method of manufacturing a redistribution layer structure according to an embodiment of the present disclosure. The initial stages of this embodiment are same as the stages shown in FIGS. 14A to 14D, and FIG. 15A is subsequent to FIG. 14D. As shown in FIG. 15A, the lower portion 1082 of the trenches 108a, 108a1 are filled with an interconnection metal 106a to form conductive vias.

Referring to FIG. 15B, a portion of the dielectric layer 102 that defines the trenches 108, 108a, 108_1, 108a1 (e.g., the bottom surface 108c and the side surfaces 108b of the trench 108), except for the interconnection metal 106a in the lower portion 1082, is treated to become hydrophilic that can attract a metal catalyst, while the anti-plating layer 104 remains hydrophobic to repel the metal catalyst. Therefore, a selective plating can be carried out by attracting the metal catalyst to the dielectric layer 102 defining the trenches 108, 108a, 108_1, 108a1, rather than to the surface of the anti-plating layer 104. In one or more embodiments, the portion of the dielectric layer 102 defining the trenches 108, 108a, 108_1, 108a1 is treated with a strong oxidant, an alkaline compound, or a combination thereof, for example, a material selected from a group consisting of potassium hydroxide, sodium hydroxide, and nitric acid.

Then, the portion of the dielectric layer 102 defining the trenches 108, 108a, 108_1, 108a1 and the top of interconnection metal 106a are seeded with a metal catalyst 110. Then, an electroless plating is conducted so that a conductive material 106 is formed in the trenches 108, 108a, 108_1, 108a1 and covers and contacts the interconnection metal 106a. As a result, a redistribution layer structure 100a as illustrated in FIG. 2 is obtained.

As used herein, the terms "substantially," "substantial," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, the term "about" preceding an angle can refer to a range of variation of less than or equal to ±10° of that angle, such as ±5°, ±4°, ±3°, ±2°, ±1°, ±0.5°, ±0.1°, or ±0.05°.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A redistribution layer structure, comprising:
a dielectric layer comprising an upper portion and a lower portion, the lower portion of the dielectric layer defining at least one trench, and the upper portion of the dielectric layer comprising an anti-plating layer disposed on a surface of the lower portion of the dielectric layer and defining an opening; and
a conductive material plated in the trench within the opening,
wherein the anti-plating layer does not extend over the trench, the anti-plating layer includes a hydrophobic material, and the lower portion of the dielectric layer defining the trench is hydrophilic.

2. The redistribution layer structure of claim 1, wherein the anti-plating layer is disposed on the surface of the lower portion of the dielectric layer and not in the trench.

3. The redistribution layer structure of claim 1, wherein the dielectric layer includes one of polyimide or epoxy.

4. The redistribution layer structure of claim 1, wherein a cross-section of the trench is in V-shape.

5. The redistribution layer structure of claim 1, wherein the anti-plating layer includes a material selected from a group consisting of silicon dioxide, silicon nitride, parylene-N, parylene-C, parylene-D, parylene-AF4, and a mixture thereof.

6. The redistribution layer structure of claim 1, wherein the anti-plating layer includes a first layer and a second layer, the first layer is selected from a group consisting of silicon dioxide, silicon nitride, and a combination thereof, and the second layer is selected from a group consisting of parylene-N, parylene-C, parylene-D, parylene-AF4, and a combination thereof.

7. The redistribution layer structure of claim 1, wherein a portion of the conductive material is disposed on at least a portion of the anti-plating layer.

8. The redistribution layer structure of claim 1, wherein the trench extends through the lower portion of the dielectric layer.

9. The redistribution layer structure of claim 8, wherein the trench includes an upper portion and a lower portion, and the lower portion of the trench is filled with an interconnection metal.

10. The redistribution layer structure of claim 9, wherein the conductive material covers and contacts the interconnection metal.

11. The redistribution layer structure of claim 1, further comprising a protection layer disposed on the anti-plating layer, wherein the protection layer defines an opening to expose the conductive material.

12. A redistribution layer structure, comprising:
a dielectric layer comprising an upper portion and a lower portion, the lower portion of the dielectric layer defining at least one trench, and the upper portion of the dielectric layer comprising an anti-plating layer disposed on a surface of the lower portion of the dielectric layer and defining an opening; and
a conductive material plated in the trench within the opening, wherein a portion of the anti-plating layer is disposed on a side surface of the trench.

13. The redistribution layer structure of claim 12, wherein the conductive material includes a material selected from a group consisting of palladium, copper and nickel.

\* \* \* \* \*